(12) United States Patent
Han

(10) Patent No.: US 9,099,456 B2
(45) Date of Patent: Aug. 4, 2015

(54) PACKAGE OF ELECTRONIC DEVICE INCLUDING CONNECTING BUMP, SYSTEM INCLUDING THE SAME AND METHOD FOR FABRICATING THE SAME

(75) Inventor: Kwon Whan Han, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 345 days.

(21) Appl. No.: 13/589,259

(22) Filed: Aug. 20, 2012

(65) Prior Publication Data

US 2013/0099374 A1 Apr. 25, 2013

(30) Foreign Application Priority Data

Oct. 19, 2011 (KR) .......................... 10-2011-0107109

(51) Int. Cl.
*H01L 23/48* (2006.01)
*H01L 23/52* (2006.01)
*H01L 29/40* (2006.01)
(Continued)

(52) U.S. Cl.
CPC ...... *H01L 23/49816* (2013.01); *H01L 21/4846* (2013.01); *H01L 21/4853* (2013.01); *H01L 23/49811* (2013.01); *H01L 24/11* (2013.01); *H01L 24/13* (2013.01); *H01L 24/16* (2013.01); *H01L 24/83* (2013.01); *H01L 24/92* (2013.01); *H01L 25/0657* (2013.01); *H05K 1/02* (2013.01); *H01L 24/29* (2013.01); *H01L 24/32* (2013.01); *H01L 24/73* (2013.01); *H01L 24/81* (2013.01); *H01L 2224/0401* (2013.01); *H01L 2224/05548* (2013.01); *H01L 2224/05567* (2013.01); *H01L 2224/1146* (2013.01); *H01L 2224/1147* (2013.01); *H01L 2224/13019* (2013.01); *H01L 2224/13021* (2013.01); *H01L 2224/13022* (2013.01); *H01L 2224/13025* (2013.01); *H01L 2224/13082* (2013.01); *H01L 2224/13101* (2013.01); *H01L 2224/13147* (2013.01); *H01L 2224/1403* (2013.01); *H01L 2224/14051* (2013.01); *H01L 2224/14181* (2013.01); *H01L 2224/16146* (2013.01); *H01L 2224/16237* (2013.01); *H01L 2224/2919* (2013.01); *H01L 2224/73104* (2013.01); *H01L 2224/73204* (2013.01); *H01L 2224/81192* (2013.01); *H01L 2224/81193* (2013.01); *H01L 2224/81203* (2013.01); *H01L 2224/81801* (2013.01); *H01L 2224/83192* (2013.01); *H01L 2224/9211* (2013.01); *H01L 2225/06513* (2013.01); *H01L 2225/06541* (2013.01); *H01L 2924/00014* (2013.01); *H01L 2924/01322* (2013.01);

(Continued)

(58) Field of Classification Search
USPC ........... 257/737, 738, 734; 438/106, 613, 614
See application file for complete search history.

(56) References Cited

U.S. PATENT DOCUMENTS 7,292,055 B2 * 11/2007 Egitto et al. ............. 324/754.18
2003/0111733 A1 * 6/2003 Pogge et al. ................. 257/774

(Continued)

*Primary Examiner* — Khiem D Nguyen
*Assistant Examiner* — Wilner Jean Baptiste
(74) *Attorney, Agent, or Firm* — William Park & Associates Ltd.

(57) ABSTRACT

A package of an electronic device, a system including the same and a method for fabricating the same are provided. The package of the electronic device includes a substrate, a step difference layer and a connecting bump. The substrate allows a connecting contact part to be exposed on a surface thereof. The step difference layer covers the substrate so as to leave the connecting contact part exposed. The connecting bump is connected to the connecting contact part so that one end part of the connecting bump is extended on the step difference layer, and has a sloped upper surface formed by a step difference formed by the step difference layer.

26 Claims, 12 Drawing Sheets

(51) Int. Cl.
*H01L 21/00* (2006.01)
*H01L 21/44* (2006.01)
*H01L 23/498* (2006.01)
*H05K 1/02* (2006.01)
*H01L 21/48* (2006.01)
*H01L 23/00* (2006.01)
*H01L 25/065* (2006.01)
*H05K 3/40* (2006.01)

(52) U.S. Cl.
CPC ...... *H01L2924/07802* (2013.01); *H05K 3/4007* (2013.01); *Y10T 29/49* (2015.01)

(56) References Cited

U.S. PATENT DOCUMENTS

2006/0189099 A1* 8/2006 Lu et al. .................. 438/460
2011/0316149 A1* 12/2011 Suzuki et al. ............ 257/737

* cited by examiner

PACKAGE OF ELECTRONIC DEVICE INCLUDING CONNECTING BUMP, SYSTEM INCLUDING THE SAME AND METHOD FOR FABRICATING THE SAME

CROSS-REFERENCES TO RELATED APPLICATIONS

The present application claims priority under 35 U.S.C 119(a) to Korean Application No. 10-2011-0107109, filed on Oct. 19, 2011, in the Korean Intellectual Property Office, which is incorporated herein by reference in its entirety as set forth in full.

BACKGROUND

1. Field of the Invention

Example embodiments of the present invention relate to a technology for packaging an electronic device, and more particularly, to a package of an electronic device including a connecting bump, a system including the same and a method for fabricating the same.

2. Description of the Related Art

Electronic devices required in electronic appliances include various active and passive circuit elements. The circuit elements may be integrated on semiconductor substrates called semiconductor chips or dies. Electronic devices of an integrated circuit are packages mounted on a package substrate including circuit interconnections, such as a PCB or Si interposer, and may be mounted on a printed circuit board of an electronic appliance such as a computer, mobile appliance or data storage.

When a semiconductor chip is mounted on a package substrate so that the semiconductor chip is electrically connected to the package substrate, or when semiconductor chips are electrically connected to each other, the connection structure using a connecting bump is frequently used in a package of an electronic device. For example, a flip-chip package is advantageously used as a stacked structure of various type semiconductor chips, and employs connecting bumps so as to secure a large number of input/output (I/O) terminals.

After the package substrate and the semiconductor chip are electrically connected by bonding connecting bumps, an insulating layer is formed using an under-fill process so as to insulate the connecting bumps by surrounding a bonding structure of the connecting bumps. As the thickness of the package of the electronic device is decreased, the height of the connecting bumps is lowered due to the decreased thickness of the package, and the size of the connecting bumps is also decreased. Therefore, the interval between the connecting bumps is narrowed. Accordingly, the height of a space between the connecting bumps, to be filled with the under-fill insulating layer, is lowered and narrowed, hence the under-fill insulating layer is not filled in the space between the connecting bumps. As a result, there occurs a failure in which a void is formed in the space between the connecting bumps.

SUMMARY

An embodiment of the present invention relates to a structure of a connecting bump, which can effectively prevent the reliability of an electronic device or package of the electronic device from being deteriorated due to a non-conductive adhesive layer remaining at an interface between two connecting bumps when the opposite connecting bumps are bonded to each other penetrating into the non-conductive adhesive layer for insulating and adhering between a substrate of a semiconductor chip and a package substrate or between the substrate of the semiconductor chip and a substrate of another semiconductor chip.

In one embodiment, a package of an electronic device includes a substrate configured to allow a connecting contact part to be exposed on a surface thereof; a step difference layer configured to cover the substrate so as to leave the connecting contact part exposed; and a connecting bump configured to be connected to the connecting contact part so that one end part of the connecting bump is extended on the step difference layer, and have a sloped upper surface formed by a step difference formed by the step difference layer.

The substrate may be a semiconductor substrate of a semiconductor chip, on which an integrated circuit is integrated, a printed circuit board (PCB) on which the semiconductor chip is to be mounted, or a package substrate including an interposer substrate.

The semiconductor substrate may include a through electrode providing the connecting contact part as an exposed surface.

The package may further include a conductive layer configured to be connected to the exposed surface of the through electrode on the substrate so as to be used as a contact pad or redistribution layer (RDL).

The step difference layer may include an insulating layer having an opening through which the connecting contact part is exposed.

A part of the insulating layer, constituting a sidewall of the opening, may be vertical or inclined.

One end part of the connecting bump may be extended to cover a first sidewall part of two opposite sidewall parts of the opening of the insulating layer, and may be formed to leave exposed a second sidewall part opposite to the first sidewall part.

The connecting bump may include a first corner part at an edge of the sloped surface and a second corner part opposite to the first corner part, and the first and second corner parts may be formed to have different heights from each other by the step difference.

The connection bump may further include a metal pillar and a solder adhesive layer formed on an upper surface of the metal pillar.

In another embodiment, a package of an electronic device includes a substrate configured to allow a connecting contact part to be exposed on a surface thereof; a non-conductive adhesive layer configured to be adhered to the substrate; and a connecting bump configured to be connected to the connecting contact part and have a sloped surface formed on an upper surface thereof so as to pass through the non-conductive adhesive layer.

In another embodiment, a package of an electronic device includes a substrate configured to allow first and second connecting contact parts respectively to be exposed to upper and lower surfaces thereof; first and second step difference layers configured to respectively cover the upper and lower surfaces of the substrate so that the first and second connecting contact parts are exposed to the upper and lower surfaces of the substrate; and first and second connecting bumps configured to be respectively connected to the first and second connecting contact part so that one end parts of the first and second connecting bumps are extended on the first and second step difference layers, and respectively have first and second sloped surfaces inclined at different angles from each other on upper surfaces of the first and second connecting bumps where the first and second sloped surfaces are formed by step differences formed by the first and second step difference layers.

The first and second step difference layers may have different thicknesses from each other so that the first and second sloped surfaces of the first and second connecting bumps are formed to have different slopes from each other.

The first and second step difference layers may have first and second openings through which the first and second connecting contact parts are exposed, respectively, and sidewalls of the first and second openings may have different slopes from each other so that the first and second sloped surfaces of the first and second connecting bumps are formed to have different slopes from each other.

In another embodiment, a package of an electronic device includes a first substrate configured to allow a first connecting contact part to be exposed on a surface thereof; a first step difference layer configured to cover the first substrate so as to leave the first connecting contact part exposed; a first connecting bump configured to be connected to the first connecting contact part so that one end part of the first connecting bump is extended on the first step difference layer, and has a first sloped surface formed on an upper surface of the first connecting bump where the first sloped surface is formed by a step difference formed by the first step difference layer; a second substrate configured to allow a second contact part to be exposed on a surface thereof so as to be opposite to the first connecting contact part; a second step difference layer configured to cover the second substrate so as to leave the second connecting contact layer exposed; a second connecting bump configured to be connected to the second connecting contact part so that one end part of the second connecting bump is extended on the second step difference layer, and has a second sloped surface formed on an upper surface of the second connecting bump where the second sloped surface is formed by a step difference formed by the second step difference layer; a conductive adhesive layer configured to come in contact with the first and second sloped surfaces so as to adhere the first and second connecting bumps to each other; and a non-conductive adhesive layer configured to surround the first and second connecting bumps and the conductive adhesive layers so as to adhere the first and second step difference layers to each other.

The first and second step difference layers may have different thicknesses from each other so that the first and second sloped surfaces of the first and second connecting bumps have different slopes from each other.

The first and second step difference layers may have first and second openings through which the first and second connecting contact parts are exposed, respectively, and sidewalls of the first and second openings may have different slopes so that the first and second sloped surfaces of the first and second connecting bumps have different slopes.

The first and second sloped surfaces of the first and second connecting bumps may be inclined opposite to each other, and the conductive adhesive layer may be a layer extended and inclined to the first and second substrates.

The first and second sloped surfaces of the first and second connecting bumps may be inclined opposite to each other so as to have different slopes from each other, and the conductive adhesive layer may be a layer extended and inclined to the first and second substrates so that a thickness of the layer is increased along the first and second sloped surfaces.

The non-conductive adhesive layer may be a non-conductive paste (NCP) layer or non-conductive film (NCF) layer.

In another embodiment, a package of an electronic device includes a first substrate configured to allow a first connecting contact part to be exposed on a surface thereof; a first connecting bump configured to be connected to the first connecting contact part; a second substrate configured to allow a second connecting contact part to be exposed to a surface thereof so as to be opposite to the first connecting contact part; a step difference layer configured to cover the second substrate so as to leave the second connecting contact part exposed; a second connecting bump configured to be connected to the second connecting contact part so that one end part of the second connecting bump is extended on the step difference layer, and have a sloped surface formed on an upper surface of the second connecting bump where the sloped surface is formed by a step difference formed by the step difference layer; a conductive adhesive layer configured to come in contact with an upper surface of the first connecting bump and the sloped surface of the second connecting bump so as to adhere the first and second connecting bumps to each other; and non-conductive adhesive layers configured to surround the first and second connecting bumps and the conductive adhesive layer so as to adhere the first and second substrates to each other.

In another embodiment, a package of an electronic device includes a first semiconductor substrate configured to allow first and second connecting contact parts to be respectively exposed on upper and lower surfaces thereof; first and second step difference layers configured to respectively cover the upper and lower surfaces of the first semiconductor substrate so as to leave the first and second connecting contact layers exposed; first and second connecting bumps configured to be respectively connected to the first and second connecting contact parts so that one end part of each of the first and second connecting bumps are extended on the first and second step difference layers, and respectively have first and second sloped surfaces inclined different from each other on upper surfaces of the first and second connecting bumps where the sloped surfaces are formed by step differences formed by the first and second step difference layers; a second semiconductor substrate configured to allow a third connecting contact part to be exposed to a surface thereof so as to be opposite to the first connecting contact part; a third step difference layer configured to cover the second substrate so as to leave the third connecting contact part exposed; a third connecting bump configured to be connected to the third connecting contact part so that one end part of the third connecting bump is extended on the third step difference layer, and have a third sloped surface formed on an upper surface of the third connecting bump where the third sloped surface is formed by a step difference formed by the third step difference layer; first conductive adhesive layers configured to come in contact with the first to third sloped surfaces so as to adhere the first to third connecting bumps to each other; a first non-conductive adhesive layer configured to surround the first to third connecting bumps and the first conductive adhesive layers so as to adhere the first to third step difference layers to each other; a package substrate configured to allow a fourth connecting contact part to be exposed on a surface thereof so as to be opposite to the second connecting contact part; a second conductive adhesive layer configured to come in contact with the fourth connecting contact part and the second sloped surface so as to adhere the second connecting bump and the fourth connecting contact part to each other; and a second non-conductive adhesive layer configured to surround the second connecting bump, the fourth connecting contact part and the second conductive adhesive layer so as to adhere the package substrate and the second step difference layer to each other.

The package may further include a fourth step difference layer configured to cover the surface of the package substrate so as to leave the fourth connecting contact part exposed; and a fourth connecting bump configured to be connected to the fourth connecting contact part so that one end part of the fourth connecting bump is extended on the fourth step difference layer, and having a fourth sloped surface formed on an upper surface of the fourth connecting bump by a step difference formed where the fourth sloped surface is formed by the fourth step difference layer.

In another embodiment, a package of an electronic device includes semiconductor substrates configured to be stacked so that each of the semiconductor substrates has first and second connecting bumps having first and second sloped surfaces as upper surfaces thereof, which are formed on upper and lower surfaces thereof, respectively, and the first sloped surfaces of the first connecting bumps are aligned opposite to the second sloped surfaces of the second connecting bumps; conductive adhesive layers configured to each come in contact with the first and second sloped surfaces so as to adhere the first and second connecting bumps of the two stacked semiconductor substrates to each other; non-conductive adhesive layers configured to surround the first and second connecting bumps and connecting parts of the conductive adhesive layers so as to adhere the semiconductor substrates to one another; and a package substrate configured to allow the stacked semiconductor substrates mounted thereon.

In another embodiment, a method for fabricating a package of an electronic device includes forming a step difference layer that leaves a connecting contact part exposed on a surface of a substrate; and forming a connecting bump which is connected to the connecting contact part so that one end part of the connecting part is extended on the step difference layer, and has a sloped surface formed on an upper surface of the connecting bump where the sloped surface is formed by a step difference formed by the step difference layer.

In another embodiment, a method for fabricating a package of an electronic device includes forming first and second step difference layers respectively having first and second openings that leave exposed first and second connecting contact parts positioned on upper and lower surface of a substrate; and forming first and second connecting bumps which are respectively connected to the first and second connecting contact parts so that one end parts of the first and second connecting bumps are extended on the first and second step difference layers, and have first and second sloped surfaces formed on upper surfaces of the first and second connecting bumps where the sloped surfaces are formed by step differences formed by the first and second step difference layers.

The forming of the step difference layer may include forming an insulating layer on the substrate so as to cover the connecting contact part; and forming a first opening in the insulating layer so as to leave a surface of the connecting contact surface exposed.

The forming of the first opening may include selectively removing a part of the insulating layer so that a sidewall of the insulating layer, constituting the first opening, is vertical or inclined.

The method may further include performing reflowing on a part of the sidewall of the insulating layer so that the slope of the sidewall of the insulating layer, constituting the first opening, is formed less steeply after forming the first opening.

In another embodiment, a method for fabricating a package of an electronic device includes forming a first step difference layer that leave exposed a first connecting contact part to a surface of a first substrate; forming a first connecting bump which is connected to the first connecting contact part so that one end part of the first connecting bump is extended on the first step difference layer, and has a first sloped surface formed on an upper surface of the first connecting bump by a step difference formed by the first step difference layer; forming a non-conductive adhesive layer on the first step difference layer so as to cover the first connecting bump; forming a second step difference layer for exposing a second connecting contact part corresponding to the first connecting contact part to a surface of a second substrate; forming a second connecting bump which is connected to the second connecting contact part so that one end part of the second connecting bump is extended on the second step difference layer, and has a second sloped surface formed on an upper surface of the second connecting bump by a step difference formed by the second step difference layer; forming a conductive adhesive layer a surface of the second connecting bump; and thermally compressing the second substrate to the first substrate so that a part of the non-conductive adhesive layer are pushed outside a surface of the first connecting bump along the first sloped surface by penetrating the second connecting bump into the non-conductive adhesive layer, and the conductive adhesive layer bonds the second and first connecting bumps to each other.

In another embodiment, a method for fabricating a package of an electronic device includes forming a first connecting bump connected to a first connecting contact part on a surface of a first substrate; forming a non-conductive adhesive layer on the first substrate so as to cover the first connecting bump; forming a step difference layer for exposing a second connecting contact part corresponding to the first connecting contact part to a surface of a second substrate; forming a second connecting bump which is connected to the second connecting contact part so that one end part of the second connecting bump is extended on the step difference layer, and has a sloped surface formed on an upper surface of the second connecting bump by a step difference formed by the step difference layer; forming a conductive adhesive layer on a surface of the second connecting bump; and thermally compressing the second substrate to the first substrate so that a part of the non-conductive adhesive layer is pushed outside a surface of the first connecting bump by penetrating the second connecting bump into the non-conductive adhesive layer, and the conductive adhesive layer bonds the second and first connecting bumps to each other.

In another embodiment, a method for fabricating a package of an electronic device includes forming first and second step difference layers respectively having first and second openings for exposing first and second connecting contact parts positioned on an upper and lower surfaces of a first semiconductor substrate; forming first and second connecting bumps which are respectively connected to the first and second connecting contact parts so that one end part of each of the first and second connecting bumps are extended on the first and second step difference layers, and having first and second sloped surfaces formed on upper surfaces of the first and second connecting bumps where the sloped surfaces are formed by step differences formed by the first and second step difference layers; forming a first non-conductive adhesive layer on the first step difference layer so as to cover the first connecting bump; forming a third step difference layer for exposing a third connecting contact part corresponding to the first connecting contact part to a surface of a second semiconductor substrate; forming a third connecting bump which is connected to the third connecting contact part so that one end part of the third connecting bump is extended on the third step difference layer, and has a third sloped surface formed on an upper surface of the third connecting bump where the third sloped surface is formed by a step difference formed by the third step difference layer; forming a first conductive adhesive layer on a surface of the third connecting bump; thermally compressing the second semiconductor substrate to the first semiconductor substrate so that a part of the first non-conductive adhesive layer is pushed outside a surface of the first connecting bump along the first sloped surface by penetrating the third connecting bump into the first non-conductive adhesive layer, and the first conductive adhesive layer bonds the third and first connecting bumps to each other; forming a second conductive adhesive layer on a surface of the second connecting bump; forming a second non-conductive adhesive layer for covering a fourth connecting contact part exposed opposite to the second connecting contact part on a surface of a package substrate; and thermally compressing the first semiconductor substrate to the package substrate so that a part of the second non-conductive layer is pushed outside a surface of the fourth connecting contact part along the second sloped surface by penetrating the second connecting bump into the second non-conductive adhesive layer, and the second conductive adhesive layer bonds the second and fourth connecting bumps to each other.

In another embodiment, a system includes a main board; and a package of an electronic device to be mounted on the main board. In the system, the package of the electronic device includes a first substrate configured to allow a first connecting contact part to be exposed to a surface thereof; a first step difference layer configured to cover the first substrate so as to expose the first connecting contact part; a first connecting bump configured to be connected to the first connecting contact part so that one end part of the first connecting bump is extended on the first step difference layer, and has a first sloped surface formed on an upper surface of the first connecting bump by a step difference formed by the first step difference layer; a second substrate configured to allow a second contact part to be exposed to a surface thereof so as to be opposite to the first connecting contact part; a second step difference layer configured to cover the second substrate so as to expose the second connecting contact layer; a second connecting bump configured to be connected to the second connecting contact part so that one end part of the second connecting bump is extended on the second step difference layer, and has a second sloped surface formed on an upper surface of the second connecting bump where the second sloped surface is formed by a step difference formed by the second step difference layer; a conductive adhesive layer configured to come in contact with the first and second sloped surfaces so as to adhere the first and second connecting bumps to each other; and a non-conductive adhesive layer configured to surround the first and second connecting bumps and the conductive adhesive layers so as to adhere the first and second step difference layers to each other.

In another embodiment, a package of an electronic device includes a first package substrate configured to allow a first connecting contact part to be exposed to a surface thereof; a first step difference layer configured to cover the first package substrate so as to expose the first connecting contact part; a first connecting bump configured to be connected to the first connecting contact part so that one end part of the first connecting bump is extended on the first step difference layer, and have a first sloped surface formed on an upper surface of the first connecting bump by a step difference formed by the first step difference layer; a semiconductor substrate configured to allow a second connecting contact part opposite to the first connecting contact part to be exposed one surface thereof, and allow a second package substrate to be attached to a surface opposite to the one surface thereof; a second step difference layer configured to cover the semiconductor substrate so as to expose the second connecting contact part; a second connecting bump configured to be connected to the second connecting contact part so that one end part of the second connecting bump is extended on the second step difference layer, and have a second sloped surface formed on an upper surface of the second connecting bump by a step difference formed by the second step difference layer; a conductive adhesive layer configured to comes in contact with the first and second sloped surfaces so as to adhere the first and second connecting bumps to each other; and a non-conductive adhesive layer configured to surround the first and second connecting bumps and the conductive adhesive layer and be extended to cover a side of a semiconductor chip and the second package substrate so that the semiconductor chip is embedded between the first and second package substrates.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Embodiments of the present invention illustrate that a connecting bump used for the purpose of electrical connection to a surface of a semiconductor substrate of a semiconductor chip or a surface of a package substrate is formed into a structure of a pillar-shaped bump provided with a sloped surface inclined, on one side direction, of an upper surface thereof. The upper surface of the connecting bump is formed to have a sloped surface to effectively prevent a non-conductive adhesive layer from getting into a connecting interface between connecting bumps. Here, the non-conductive adhesive layer is formed to insulate between the semiconductor substrate of the semiconductor chip and the package substrate having the semiconductor chip mounted thereon, or to insulate between the semiconductor substrate of the semiconductor chip and a semiconductor substrate of another semiconductor chip, and to isolate the structure of the connecting bump.

When two connecting bumps aligned opposite to each other are connected and bonded to each other by passing through the non-conductive adhesive layer, a part of the non-conductive adhesive layer may discharge to an outer side along the sloped surface of the connecting bump in a thermal compression process for bonding the connecting bumps. Accordingly, it is possible to prevent a part of the non-conductive adhesive layer from getting into an interface between the connecting bumps. Further, it is possible to prevent a part of the non-conductive adhesive layer from getting into an interface between the connecting bumps, so that the operating performance and reliability of the electronic device having the connecting bump does not deteriorate because of non-conductive adhesive layer remaining between the connecting bumps.

Figure 1:
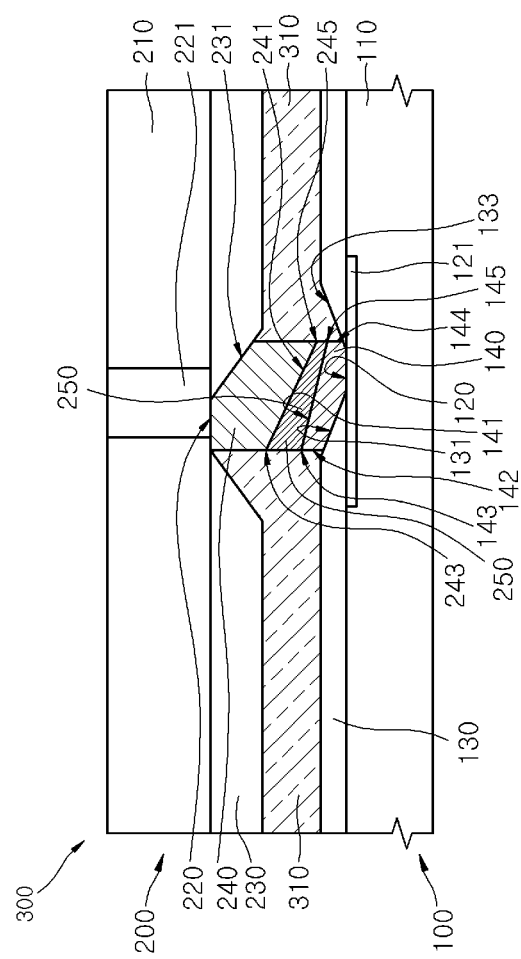
FIGS. 1 to 3 illustrate an example of a package of an electronic device according to an embodiment of the present invention.
Figure 2:
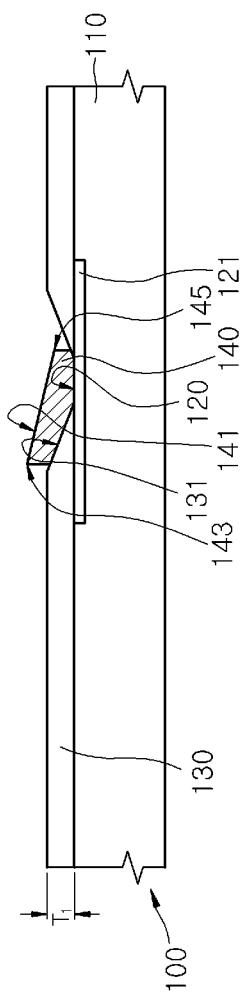
Figure 3:
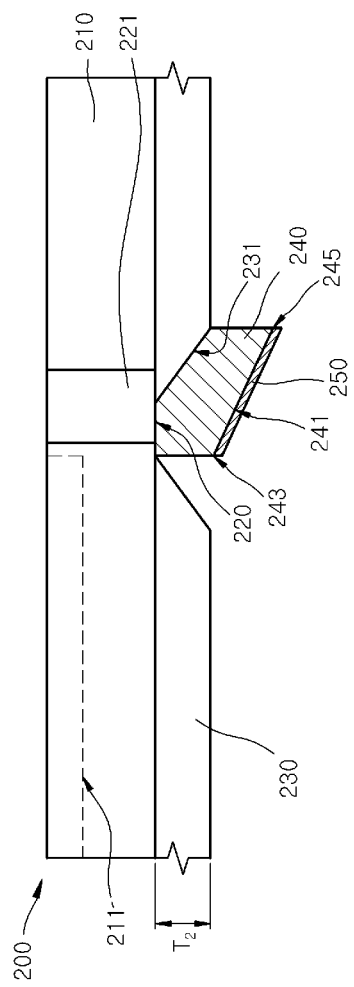

FIGS. 1 to 3 illustrate an example of a package of an electronic device including a structure of a connecting bump according to an embodiment of the present invention. As illustrated in FIG. 1, the package of the electronic device may have a structure in which a semiconductor chip 200 is mounted on a package substrate 100, i.e., a structure of a flip-chip package 300. In this case, electronic device refers to a semiconductor chip 200 including a semiconductor substrate 210 having an integrated circuit integrated thereon. The semiconductor chip 200 may be a DRAM chip or flash memory chip. The electronic device may include various types of printed circuit boards (PCBs) or interposers in which a conductive interconnection such as a conductive pad 121 for electrical connections is provided as a circuit interconnection on the package substrate 100 having the semiconductor chip 200 mounted thereon, e.g., on an insulating substrate 110.

The package substrate 100 constituting the package of the electronic device, as illustrated in FIGS. 1 and 2, may be a PCB having the conductive pad 121 that is a circuit interconnection on a core or the insulating substrate 110. The conductive pad 121 provides a first connecting contact part 120, for electrical connection outside the semiconductor chip 200, as an exposed surface on a surface of the insulating substrate 110. It will be understood that the term "first," "second," etc. described below does not specify an order, but may be used to distinguish various members from each other for convenience of illustration. Therefore, the term "first," "second," etc. may be used in chronological or reversed order, for convenience of illustration.

A first step difference layer 130, which may leave the first connecting contact part 120 exposed, is formed on the insulating substrate 110. The first step difference layer 130 may be formed with a layer made of an insulating material, a dielectric material such as a silicon oxide (SiO$_2$), or a polymer material such as polyimide. Since the polyimide layer has photosensitivity, the polyimide layer can be patterned through exposure and development. Accordingly, the polyimide layer can be more effective in a fabrication process.

A first connecting bump 140 is formed in the shape of a metal pillar. The first connecting bump 140 is formed so that an upper surface of the first connecting bump 140 has a first sloped surface 141. The first sloped surface 141 of the first connecting bump 140 may be formed by a step difference that is formed by/from the first step difference layer 130 and a first sidewall part 131 of the first step difference layer 130. In other words, a step difference between the first step difference layer 130 and the first sidewall part 131 may define or form the first sloped surface 141 of the first connecting bump 140. One end part 142 of the first connecting bump 140 is extended to overlap on the first sidewall part 131 of the first step difference layer 130, but is not extended to a second sidewall part 133 formed in the first step difference layer 130. The other end part 144 of the first connecting bump 140 is substantially formed to be spaced apart from the second sidewall part 133 or to leave the second sidewall part 133 exposed. Accordingly, a step difference of the first connecting bump 140 is formed with a surface of the first connecting contact part 120 (that is, the surface of the first connecting part 120 that remains uncovered by the first step difference layer 130 which has a thickness T1) and the gradient of a sidewall surface of the first sidewall part 131. Therefore, the upper surface of the first connecting bump 140 is formed to have the first sloped surface 141 formed by the step difference.

The size of the step difference and the degree of change in step difference is varied by the degree of thickness T1 of the first step difference layer 130 and the degree of slope of the first sidewall part 131. Accordingly, the degree of slope, i.e., the slope angle of the first sloped surface 141 can vary. Since the degree of slope of the first sloped surface 141 can be changed, the difference in height between a first corner part 143 (at an edge of the first sloped surface 141) and a second corner part 145 (opposite to the first corner part 143) can be varied. That is, the first corner part 143 may have an acute angle sharper than the second corner part 145 so that the first connecting bump 140 is formed to have a protruding corner part with a sharp acute angle. On the other hand, the first corner part 143 may have an acute angle gentler than the second corner part 145 so that the first connecting bump 140 is formed to have a protruding corner part with a gentle acute angle.

As illustrated in FIG. 1, the first connecting bump 140 provided as described above may be formed in a land shape corresponding to a second connecting bump 240 to be formed in the semiconductor chip 200 mounted on the package substrate 100.

Referring to FIGS. 1 and 3, the semiconductor chip 200, to be mounted on the package substrate 100, may include the semiconductor substrate 210 having an active surface 211 on which a DRAM device or flash memory device is provided as an integrated circuit. A through electrode 221 such as a through silicon via (TSV), passing through the semiconductor substrate 210, may be provided as a connecting terminal for electrically connecting the integrated circuit formed on the active surface 211 to the outside. A second connecting contact part 220 is provided as an exposed surface of the through electrode 221, exposed on a surface of the semiconductor substrate 210, which is opposite to the surface having the active surface 211 formed thereon.

The second connecting contact part 220 is provided opposite to the first connecting contact part 120 of the package substrate 110 in FIG. 1. Like the first step difference layer 130, a second step difference layer 230 may cover the semiconductor substrate 210 so that the second connecting contact part 220 remains exposed. That is, the second step difference layer 230 is formed on the semiconductor substrate 210 so that the second connecting contact part 220 remains uncovered. The second step difference layer 230 is formed so that an upper surface of the second connecting bump 240 has a second sloped surface 241, and the second sloped surface 241 of the second connecting bump 240 may be formed to have a different slope angle from the first sloped surface 141 of the first connecting bump 140 by varying the thickness T2 of the second step difference layer 230 and the degree of slope of a sidewall part 231 of the second step difference layer 230. In this case, the slope angle of the second sloped surface 241 is greater than that of the first sloped surface 141 so that the second sloped surface 241 has a steeper slope than the first sloped surface 141. That is, the second sloped surface 241 is formed so that a third corner part 243, aligned corresponding to the first corner part 143 of the first sloped surface 141, has a lower height than a fourth corner part 245, aligned corresponding to the second corner part 145. The second sloped surface 241 is also formed so that the difference in height between the third and fourth corner parts 243 and 245 is greater than that between the first and second corner parts 143 and 145.

As illustrated in FIGS. 1 and 3, a conductive adhesive layer 250 for adhering and bonding the first and second connecting bumps 140 and 240 may be formed on the second sloped surface 241 that is an upper surface of the second connecting bump 240. In contrast, the conductive adhesive layer 250 also may be formed on the first connecting bump 140. The conductive adhesive layer 250 may be formed by coating a solder adhesive material for the bonding of the first and second connecting bumps 140 and 240. The second connecting bump 240 is formed in the shape of a metal pillar such as copper (Cu), and thus the amount of the conductive adhesive layer 250 including a solder used for adhesion or bonding can be relatively decreased. Since the amount of the conductive adhesive layer 250 can be decreased, it is possible to reduce the amount of solder flowing outside the bonding area. Solder flowing outside the bonding area may cause shorting with another neighboring bump or circuit interconnections.

As illustrated in FIG. 1, the package 300 of the electronic device, in which the first and second connecting bumps 140 and 240 are adhered and bonded to each other, is formed by mounting the semiconductor chip 200 on the package substrate 100, prepared as illustrated in FIGS. 2 and 3. In this case, the semiconductor chip 200 is thermally compressed to the package substrate 100, so that the conductive adhesive layer 250 comes in contact with the first and second sloped surfaces 141 and 241 of the first and second connecting bumps 140 and 240 as illustrated in FIG. 1. Thus, the first and second connecting bumps 140 and 240 are adhered to each other. A non-conductive adhesive layer 310, surrounds the first and second connecting bumps 140 and 240 and the conductive adhesive layer 250 which is to be isolated. The non-conductive adhesive layer 310 is formed at an interface between the package substrate 100 and the semiconductor chip 200. The non-conductive adhesive layer 310 may be formed by coating a non-conductive paste (NCP) on the package substrate 100 or by attaching a non-conductive film (NCF) to the package substrate 100 before the first and second connecting bumps 140 and 240 are bonded to each other.

Figure 4:
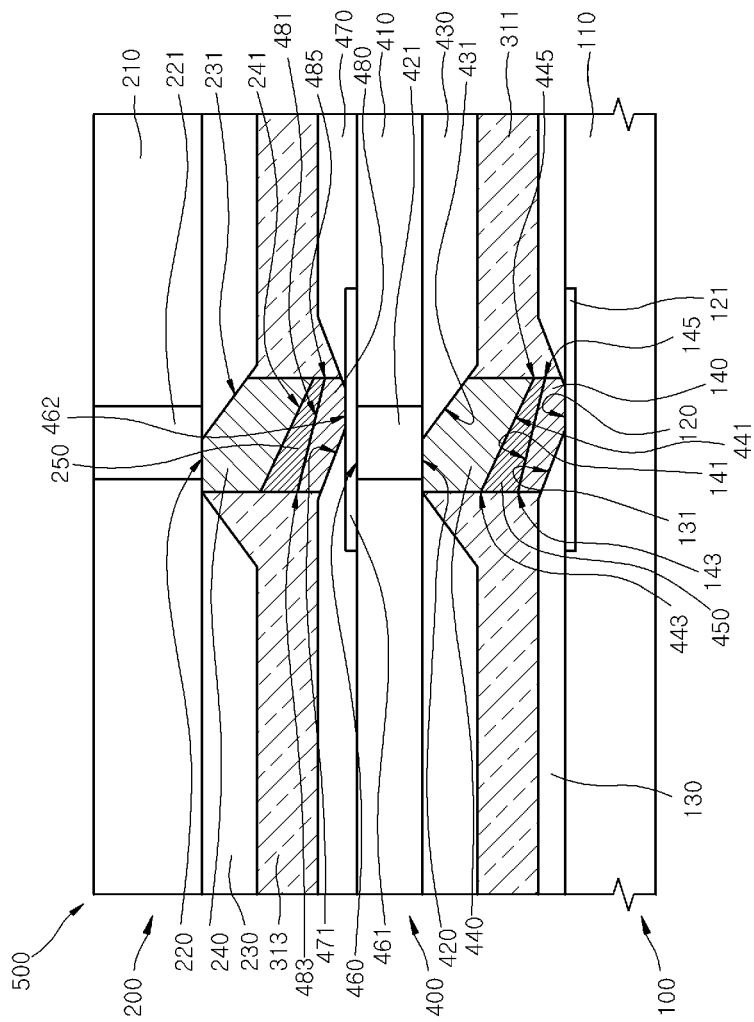
FIGS. 4 and 5 illustrate a modification in which the package of the electronic device according to an embodiment of the present invention is applied to a structure of a stack package.
Figure 5:
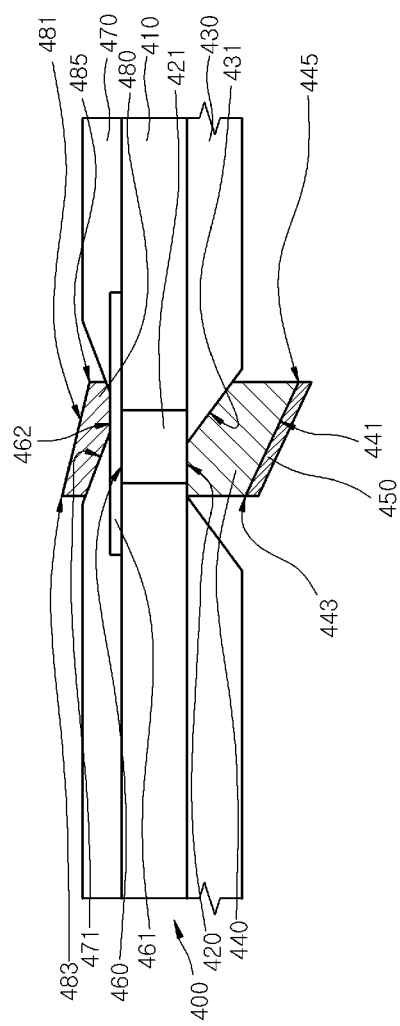

While FIGS. 1 to 3 illustrate an example of an electronic device and a package as a structure of a flip-chip package according to an embodiment of the present invention, FIGS. 4 and 5 illustrate a modification in which the package of the electronic device according to an embodiment of the present invention is applied to a structure of a stack package. In FIGS. 4 and 5, like elements are substantially designated by like reference numerals, and it will be understood that the term "first," "second," etc. described below does not specify an order or corresponding member, but may distinguish a corresponding member from another member for convenience of illustration. Although in FIGS. 4 and 5 the same reference numerals may be used to identify substantially similar components seen in FIGS. 1 to 3, these components may have a slightly different name in FIGS. 4 and 5. For example, the reference number 241 may refer to the second sloped surface in FIGS. 1 to 3, but the substantially similar component may be referred to as a fourth sloped surface 241 in FIGS. 4 and 5. Other described embodiments may follow this numbering convention. Thus, although reference numeral 241 may refer to a sloped surface in other embodiments, the name of the sloped surface may vary for different embodiments.

The stack package 500 is provided by forming a package substrate 100 as illustrated in FIG. 2 and a first semiconductor chip 400 and a second semiconductor chip 200 configured as illustrated in FIG. 3 on the package substrate 100. For example, as illustrated in FIG. 3, the first semiconductor chip 400, which may be mounted on the package substrate 100, may be configured to include a first semiconductor substrate 410 on which a DRAM device or flash memory device is provided as an integrated circuit. As illustrated in FIGS. 4 and 5, a first through electrode 421 passing through the first semiconductor substrate 410 is provided as a connecting terminal for electrically connecting the integrated circuit to an outside component. A second connecting contact part 420 corresponding to the first connecting contact part 120 and a third connecting contact part 460 that comprises a surface opposite to the second connecting contact part 420 are provided to exposed surfaces of the top and bottom of the first through electrode 421. A conductive layer 461 used as a contact pad or redistribution layer (RDL) may be further formed on the third connecting contact part 460. In this case, an exposed surface 462 of the conductive layer 461 may be substantially used as the third connecting contact part 460.

A second step difference layer 430 is formed on one surface of the first semiconductor substrate 410 opposite to the first step difference layer 130 of the package substrate 100, and a third step difference layer 470 is formed on a surface opposite to the one surface of the first semiconductor substrate 410. The second and third step difference layers 430 and 470 may be formed to have different thicknesses from each other. The second and third step difference layers 430 and 470 may also be formed so that the degrees of slopes, i.e., slope angles of sidewall parts 431 and 471 respectively are different from each other and leave exposed the second and third connecting contact parts 420 and 460.

A second connecting bump 440 is provided to the first semiconductor substrate 410. The second connecting bump 440 may have a second sloped surface 441 opposite to the first sloped surface 141 of a first connecting bump 140 on the package substrate 100. A third connecting bump 480 may have a third sloped surface 481 inclined in a direction opposite to the direction that the second sloped surface 441 is inclined. The third connecting bump 480 is provided to a surface opposite to the surface of the first semiconductor substrate 410, to which the second connecting bump 440 is provided. Degrees of slopes of the step differences formed by the second and third step difference layers 430 and 470 and the sidewall parts 431 and 471 may differ, so that it is possible to vary degrees of slopes of the second and third sloped surfaces 441 and 481 of the second and third connecting bumps 440 and 480. In this case, the second and third connecting bumps 440 and 480 are provided so that the second and third sloped surfaces 441 and 481 are inclined in directions opposite to each other, i.e., such that a first corner part 483 of the third connecting bump 480 protrudes to have a relatively high height is positioned at a same side as a first corner part 443 of the second connecting bump 440, which protrudes to have a relatively low height. A second corner part 485 of the third connecting bump 480, which protrudes to have a relatively low height, is positioned at a same side as a second corner part 445 of the second connecting bump 440, which protrudes to have a relatively high height. A first conductive adhesive layer 450 for bonding of the bumps may be formed on a surface of the second connecting bump 440.

The second semiconductor chip 200, as illustrated in FIG. 3, which may be stacked on the first semiconductor chip 400, has a second through electrode 221 passing through a second semiconductor substrate 210, and a fourth connecting contact part 220 provided as an exposed surface of the second through electrode 221 is provided opposite to the third connecting contact part 460. A fourth step difference layer 230 is formed to leave exposed the fourth connecting contact part 220, and a fourth connecting bump 240 is provided to have a fourth sloped surface 241. A second conductor adhesive layer 250 is formed on the fourth sloped surface 241.

As illustrated in FIG. 4, the stack package 500 is configured by respectively interposing first and second non-conductive adhesive layers 311 and 313 between the first and second semiconductor chips 400 and 200 on the package substrate 100 and thermally compressing the first and second semiconductor chips 400 and 200 to the package substrate 100. In this case, the number of stacked semiconductor chips may be increased by stacking other semiconductor chips having a connecting bump structures substantially similar to that of the first semiconductor chip 400 between the first and second semiconductor chips 400 and 200.

Figure 6:
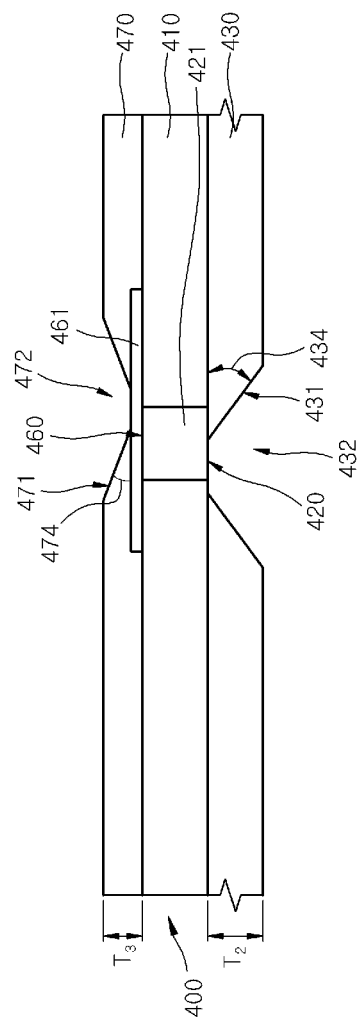
FIGS. 6 to 8 illustrate examples of a method for fabricating a structure of a connecting bump employed in the package of the electronic device according to an embodiment of the present invention.
Figure 7:
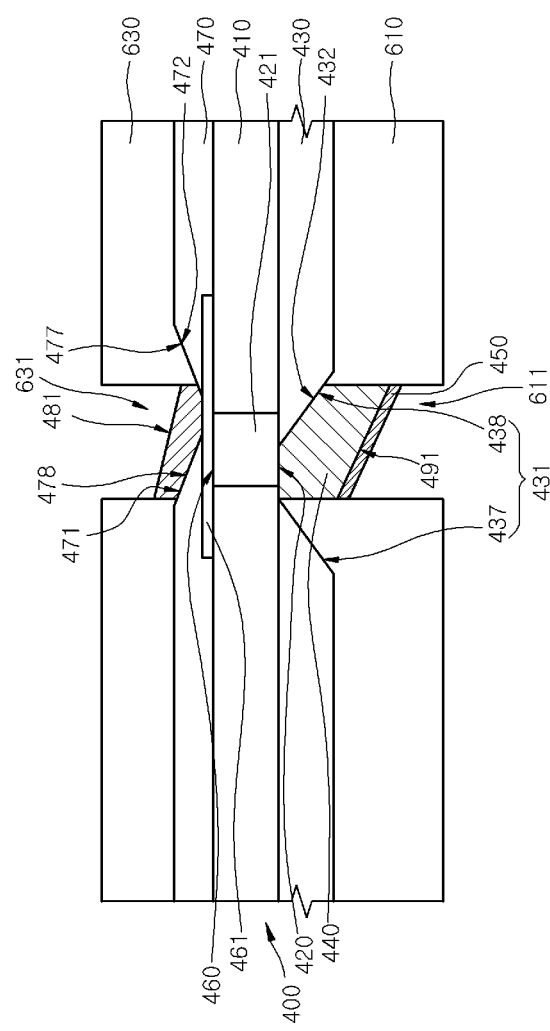
Figure 8:
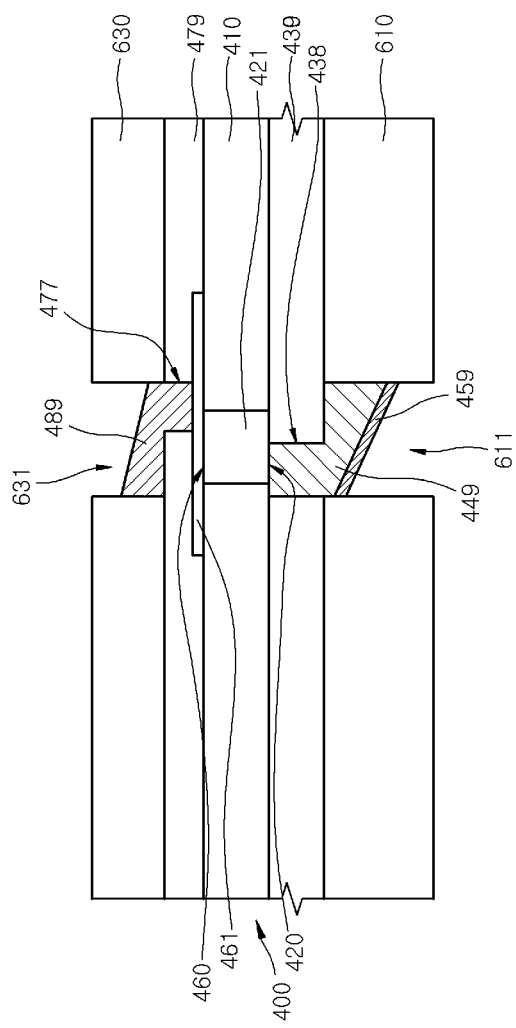

FIGS. 6 to 8 illustrate example structures that may be realized as part of a method for fabricating a structure of a connecting bump employed in the package of the electronic device according to an embodiment of the present invention. FIGS. 6 and 7 are used to illustrate a process of fabricating the connecting bumps 440 and 480 of the semiconductor chip 400 illustrated in FIG. 5 in the structure of the connecting bump having the sloped surface according to an embodiment of the present invention. The process of fabricating the structure of the connecting bump may also be applied to that of fabricating the connecting bump 140 on the package substrate 100 as illustrated in FIG. 1.

Referring to FIG. 6, the first and second step difference layers 430 and 470 are formed to leave exposed the first and second connecting contact parts 420 and 460 provided as the exposure surfaces of the through electrode 421 of the semiconductor chip 410. It will be understood that the term "first," "second," etc. described below does not necessarily specify an order or corresponding member, but distinguishes the corresponding member from another member for convenience of illustration. The step difference layers 430 and 470 may be patterned by coating an insulating layer, e.g., a polyimide layer, and performing a pattern forming process such as an exposure and development process on the coated insulating layer. The step difference layers 430 and 470 are patterned to have first and second openings 432 and 472, respectively. In this case, the slope of a first sidewall 431 of the first opening 432 may be patterned to be steeper than that of a second sidewall 471 of the second opening 472 formed on the second connecting contact part 460. That is, the step difference layers 430 and 470 are patterned so that the slope angles 434 and 474 of the sidewalls 431 and 471 of the first and second openings 432 and 473 are different from each other. The first opening 432 may be formed so that at least a portion of the first connecting contact part 420 is left exposed. The second opening 472 may be formed so that at least a portion of the second connecting contact part 460 is left exposed.

To this end, the step difference layers 430 and 470 may be patterned using a reflow process of exposing and developing the polyimide layer and then performing reflowing on the sidewalls 431 and 371 of the first and second openings 432 and 472 so as to have gentle (less steep) slopes. Degrees of reflows of the sidewalls 431 and 371 of the first and second openings 432 and 472 may be made differently by varying the thicknesses T2 and T3 of the first and second step difference layers 430 and 470, so that degrees of slopes of the sidewalls 431 and 371 of the first and second openings 432 and 472 can be different from each other. Alternatively, after the first and second step difference layers 430 and 470 are formed, a taper etch process is used when the first and second step difference layers are partially etched using a selective etch process so that the first and second openings 432 and 472 are patterned.

Then, the recipe of the etch process is controlled so that the degrees of slopes of the sidewalls 431 and 371 of the first and second openings 432 and 472 are different from each other. Accordingly, the first and second step difference layers 430 and 470 can be formed so that the degrees of slopes, i.e., slope angles of the sidewalls 431 and 371 of the first and second openings 432 and 472 are different from each other.

Referring to FIG. 7, a first mask 610 is formed to have a third opening 611 that covers a first part 437 of two opposite parts of the sidewall 431 of the first opening 432 of the first step difference layer 430, and leaves exposed a second part 438 opposite to the first part 437. A second mask 630 is formed to have a fourth opening 631 that covers a third part 477 of two opposite parts of the sidewall 471 and leaves exposed a fourth part 478 opposite to the third part 477. The masks 610 and 630 are provided as molds for providing shapes to the connecting bumps 440 and 480, respectively. When the connecting bumps 440 and 480 are formed through plating, the masks 610 and 630 may be formed as plating resist patterns.

The first and second connecting bumps 440 and 480 are formed by performing a conductive layer growing or forming process, such as a copper plating process, in the third and fourth openings 611 and 631 of the masks 610 and 630, respectively. In this case, the sloped surfaces 441 and 481 may be formed on upper surfaces of grown conductive layers by the second and fourth parts 438 and 478 of the first and second step difference layers 430 and 470 providing step differences at bottoms of the third and fourth openings 611 and 631, respectively. Accordingly, the first and second connecting bumps 440 and 480 can have the sloped surfaces 441 and 481 formed on the upper surfaces thereof, respectively, and the degrees of slopes, i.e., slope angles of the sloped surfaces 441 and 481 can be different from each other. That is, since the thickness T2 of the first step difference layer 430 and the slope angle 432 of the first sidewall 431 are different from the thickness T3 of the second step difference layer 470 and the slope angle 474 of the second sidewall 471, respectively, the step differences and the degree of slope of the step differences are different from each other, and the degree of slope of the sloped surfaces 441 and 481 of the first and second connecting bumps 440 and 480 are different from each other. The conductive adhesive layer 450 may be formed by coating a solder adhesive layer on the first sloped surface 441 of the first connecting bump 441.

As illustrated in FIGS. 6 and 7, the thicknesses of the step difference layers 430 and 470 and the degree of slope of the sidewalls are different from each other, so that the sloped surfaces 441 and 481 can be formed on the upper surfaces of the connecting bumps 440 and 480, respectively. However, when step difference layers 439 and 479 are respectively patterned to have vertical sidewalls 438 and 478 as illustrated in FIG. 8, sloped surfaces can be respectively formed on upper surfaces of connecting bumps 449 and 489 by a step difference forming structure in which the step differences are provided at the bottom of the respective third and fourth openings 611 and 631. In this case, the step differences differ by the difference in thickness between the step difference layers 439 and 479, and degree of slope of the sloped surfaces respectively formed on the upper surfaces of the connecting bumps 449 and 489 which can be different from each other by the difference between the step differences.

Figure 9:
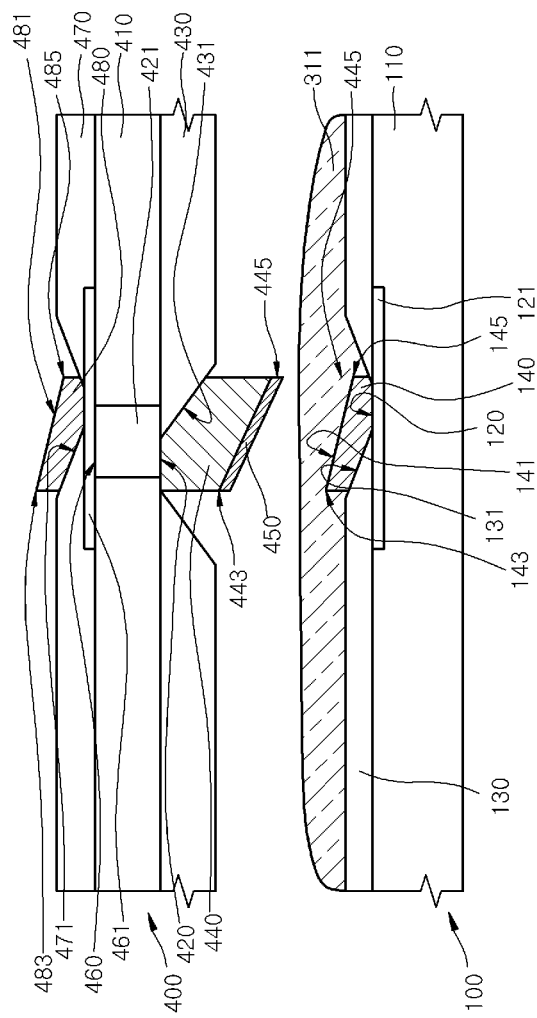
FIGS. 9 and 10 illustrate an example of a method for fabricating the package of the electronic device according to an embodiment of the present invention.
Figure 10:
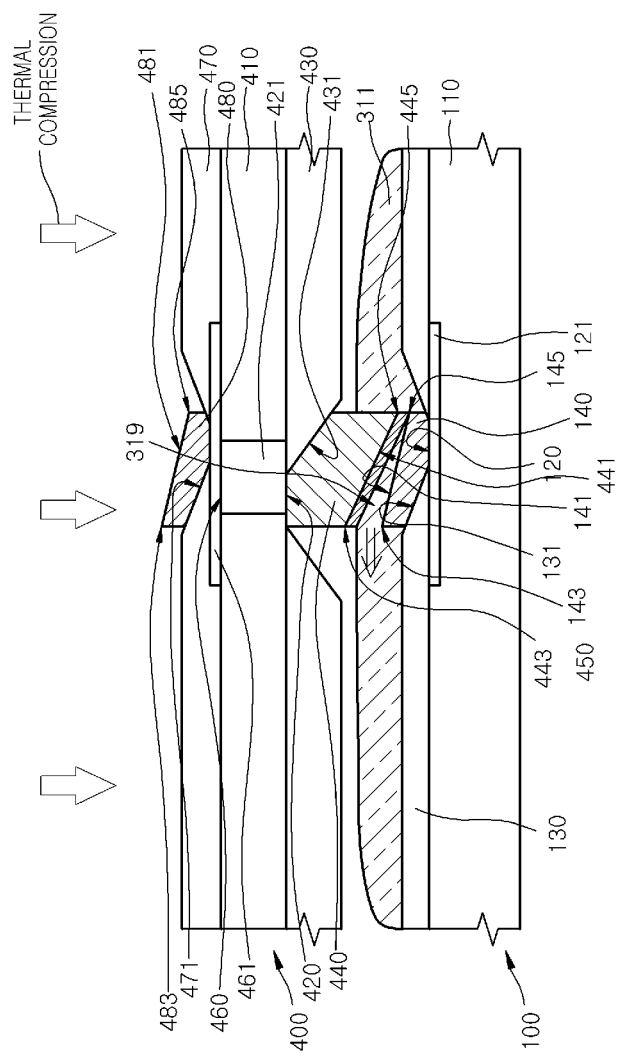

FIGS. 9 and 10 may be used in illustrating an example of a method for fabricating a package of an electronic device according to an embodiment of the present invention. In FIGS. 9 and 10, the process of fabricating a package of an electronic device through thermal compression is illustrated using the structure of the stack package 500 illustrated in FIG. 4. However, the process may be applied to the structure of the package 300 of the electronic device as illustrated in FIG. 1, and may be applied to a process of forming a stack structure between semiconductor chips.

Referring to FIG. 9, the package substrate 100 illustrated in FIG. 1 is provided by applying the process of forming the connecting bump structure described with reference to FIGS. 6 to 8, and the non-conductive adhesive layer 311 is formed by coating an NCP on the package substrate 100 or by attaching an NCF to the package substrate 100. The semiconductor chip 400 is formed on the non-conductive adhesive layer 311 by performing the process of forming the connecting bump structure described with reference to FIGS. 6 to 8.

After the semiconductor chip 400 is formed so that the second connecting bump 440 of the semiconductor chip 400 is aligned with the first connecting bump 140, one end part of the first connecting bump 140 (e.g., the conductive adhesive layer 450 positioned at the second corner part 445 of the second connecting bump 440) first comes in contact with the second corner part 145 of the first connecting bump 140 by penetrating the second connecting bump 440 into the non-conductive adhesive layer 311. To this end, the sloped surface 441 of the second connecting bump 440 may be formed to have a slope angle greater than the sloped surface 141 of the first connecting bump 140. Alternatively, the upper surface of the first connecting bump 140 may be formed with a flat surface in place of the sloped surface 141.

If the sloped surfaces 141 and 441 of the first and second connecting bumps 140 and 440 are provided to have different slope angles from each other, one end part of the conductive adhesive layer 450 first comes in contact with one end part of the first connecting bump 140 as illustrated in FIG. 10. Subsequently, if the thermal compression is continuously performed, the area of the conductive adhesive layer 450 coming in contact with the sloped surface 141 of the first connecting bump 140 increases along the sloped surface 141 of the first connecting bump 140, and accordingly, parts 319 of the non-conductive adhesive layer 311, which exist between the first and second connecting bumps 140 and 440, are pushed outside the area between the first and second connecting bumps 140 and 440. Since the parts 319 of the non-conductive adhesive layer 311 are pushed along the slopes of the sloped surfaces 141 and 441 and then flowed outside of the connecting bumps 140 and 440, the probability that the parts of the non-conductive adhesive layer 311 will remain between the conductive adhesive layer 450 and the first connecting bump 140 is effectively decreased. Accordingly, the thermal compression process is completed, and the conductive adhesive layer 450 comes in contact with both the first and second connecting bumps 140 and 440 as illustrated in FIG. 4 so that the first and second connecting bumps 140 and 440 are bonded to each other. In this case, the parts 319 of the non-conductive adhesive layer 311 do not remain at the interface between the first and second connecting bumps 140 and 440. As a result, the degree of slope of the sloped surfaces of the first and second connecting bumps 140 and 440 are different from each other, so that the thickness of the conductive adhesive layer 450 is increased or decreased in one direction.

The package of the electronic device using the connecting bump structure of the present invention as described above effectively prevents the parts of the non-conductive adhesive layer 311 from remaining between first and second connecting bumps 140 and 440. Accordingly, the first and second connecting bumps 140 and 440 may be connected using the conductive adhesive layer 450 in a manner such that the non-conductive adhesive layer 311 does not remain between the first and second connecting bumps 140 and 440, so that it is possible to improve electrical and mechanical stability of the connecting bump structure and to effectively ensure reliability of the package of the electronic device.

Figure 11:
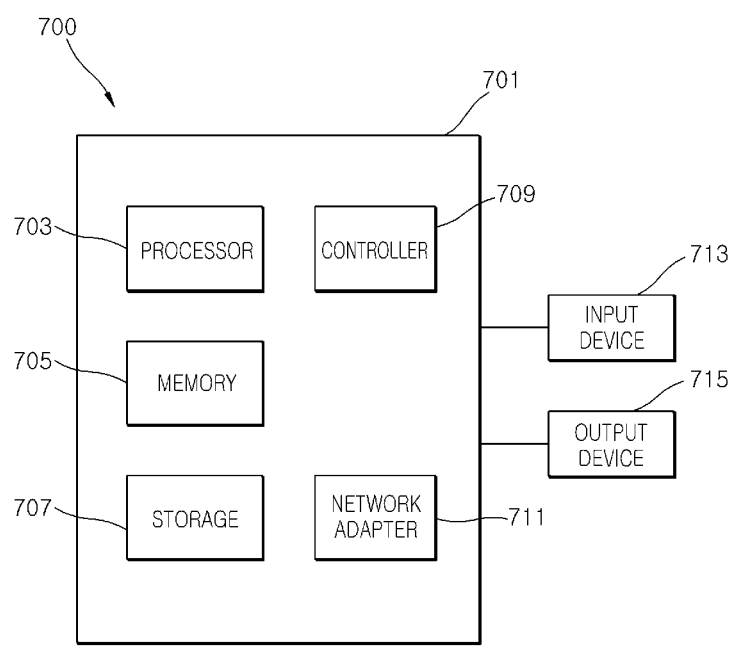
FIG. 11 illustrates a system including the package of the electronic device according to an embodiment of the present invention.

FIG. 11 illustrates a system including the package of the electronic device according to an embodiment of the present invention. The electronic devices and packages according to embodiments of the present invention may be applied to constitute the system 700 such as a computer architecture. The system 700 may be configured by mounting various electronic devices and packages on a main board 701 configured as a printed circuit board. The electronic devices and packages may be configured to include an electrical connecting structure using the connecting bumps having sloped surfaces according to embodiments of the present invention.

The system 700 may include a processor 703 such as a microprocessor mounted on the main board 701, a memory 705 that is a volatile memory such a DRAM, a storage 707 including a non-volatile memory or hard disk, a controller 709 such as a video controller for providing images, and a network adapter 717 for network communication. Program data stored in the storage 707 is loaded to the memory 705 and executed by the processor 703. The storage 707 may be configured as a solid state drive (SDD) including flash memories. An input device 713 for data input, e.g., a keyboard or touch sensitive display screen may be connected to the system 700, and an output device 715 for data output, e.g., a display monitor, printer or display screen may be connected to the system 700. The system 700 may be a mobile system such as a personal computer (PC), server, laptop computer, handheld computer or smart phone, which is configured by mounting the electronic devices on the main board 701.

Meanwhile, the connecting bump structure having sloped surfaces according to embodiments of the present invention may be applied to a package of an electronic device having a structure of an embedded device, in which a semiconductor chip is embedded in an insulating layer of a printed circuit board.

Figure 12:
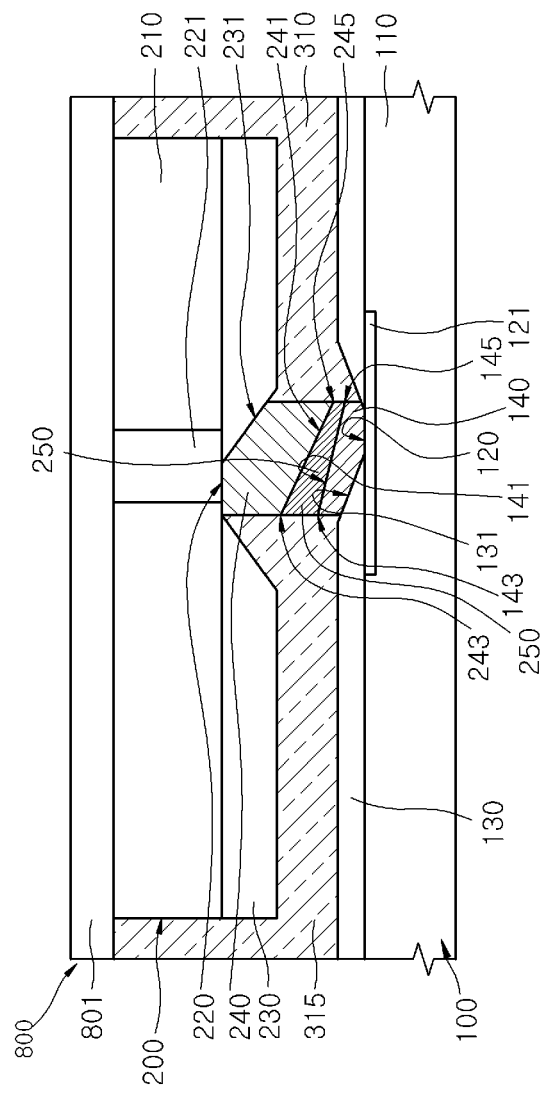
FIG. 12 illustrates another modification in which the package of the electronic device according to an embodiment of the present invention is applied to a structure of an embedded package.

FIG. 12 illustrates another modification in which the package of the electronic device according to an embodiment of the present invention is applied to an embedded package. The package 800 of the electronic device may be configured into a structure of an embedded substrate, in which an electronic device such as the semiconductor chip 200 is embedded in a non-conductive adhesive layer 315 between the first package substrate 100 and a second package substrate 801. It will be understood that the term "first," "second," etc. described below does not specify an order or corresponding member, but distinguishes the corresponding member from another member for convenience of illustration. As described with reference to FIG. 2, the first package substrate 100 is provided. The second package substrate 801 is an insulating substrate, and may be formed as a core substrate in which a layer made of an insulating material constituting a printed circuit board, e.g., an epoxy layer or glass fiber, is embedded in the non-conductive layer 315.

As described with reference to FIG. 9, the non-conductive adhesive layer 315 is formed by coating an NCP on the first package substrate 100 or by attaching an NCF to the first package substrate 100. The semiconductor chip 200 to be mounted on the first package substrate 100 having the first connecting bump 140 formed thereon is provided as described with reference to FIG. 3, and the second package substrate 801 is attached to a surface opposite to a protruded surface of the second connecting bump 240. After the semiconductor chip 200 is attached to the second package substrate 801 using an adhesive layer (not shown), as described with reference to FIG. 10, the semiconductor chip 200 is thermally compressed so that the second connecting bump 240 is bonded to the first connecting bump 140 by the conductive adhesive layer 250 by penetrating the second connecting bump 250 into the non-conductive adhesive layer 315. In this case, the non-conductive adhesive layer 315, moved by heat applied in the thermal compression process, is moved to cover a side of the semiconductor chip 200, and is adhered to the semiconductor chip 200 by coming in contact with the second package substrate 801 having the semiconductor chip 200 attached thereto. Accordingly, the semiconductor chip 200 is in a state where the semiconductor chip 200 is embedded in the non-conductive adhesive layer 315. Further, the first package substrate 100 is adhered not only to the semiconductor chip 200 but also to the second package substrate 801 by the non-conductive adhesive layer 315, so that the package 800 of the electronic device is configured to have the structure of the embedded substrate.

When the connecting bump structure having sloped surfaces according to embodiments of the present invention is applied to the package of the electronic device having the structure of the embedded substrate, because of the sloped surfaces of the connecting bumps, the second connecting bump 240 can penetrate into the non-conductive adhesive layer 315 and it is possible to effectively prevent the non-conductive adhesive layer 315 from remaining at the interface between the first and second connecting bumps, particularly an interface between the conductive adhesive layer 250 and the first connecting bump 140. Thus, it is possible to improve reliability of the package 800 of the electronic device having the structure of the embedded substrate.

According to embodiments of the present invention, when connecting bumps are formed on a surface of a semiconductor substrate of a semiconductor chip or a surface of a package substrate, a sloped surface is formed on an upper surface of each of the connecting bumps, so that when two opposite connecting bumps are bonded to each other by being penetrated into a non-conductive adhesive layer for insulating and adhering between the semiconductor substrate of the semiconductor chip and the package substrate or between the semiconductor substrate of the semiconductor chip and a semiconductor substrate of another semiconductor chip, a part of the non-conductive adhesive layer positioned between the connecting bumps can be pushed outside the sloped surface when the connecting bumps are bonded together. Thus, it is possible to effectively prevent part of the non-conductive adhesive layer from remaining at an interface between the connecting bumps when the connecting bumps are bonded to each other. Accordingly, it is possible to effectively prevent the operating performance and reliability of the electronic device and the package of the electronic device from being deteriorated by non-conductive adhesive material remaining between the bonded connecting bumps.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A package of an electronic device, comprising:
a substrate configured to allow a connecting contact part to be exposed on a surface thereof;
a step difference layer configured to cover the substrate so as leave the connecting contact part exposed; and
a connecting bump configured to be connected to the connecting contact part so that one end part of the connecting bump is extended on the step difference layer, and have a sloped upper surface formed by a step difference formed by the step difference layer,
wherein the connecting bump comprises a first corner part at an edge of the sloped surface and a second corner part opposite to the first corner part, and the first and second corner parts are formed to have different heights from each other by the step difference.

2. The package of claim 1, wherein the substrate is a semiconductor substrate of a semiconductor chip, on which an integrated circuit is integrated, a printed circuit board (PCB) on which the semiconductor chip is to be mounted, or a package substrate including an interposer substrate.

3. The package of claim 2, wherein the semiconductor substrate comprises a through electrode providing the connecting contact part as an exposed surface.

4. The package of claim 3, further comprising a conductive layer configured to be connected to the exposed surface of the through electrode on the substrate so as to be used as a contact pad or redistribution layer (RDL).

5. The package of claim 1, wherein the step difference layer comprises an insulating layer having an opening through which the connecting contact part is exposed.

6. The package of claim 5, wherein a part of the insulating layer, constituting a sidewall of the opening, is vertical or inclined.

7. The package of claim 5, wherein one end part of the connecting bump is extended to cover a first sidewall part of two opposite sidewall parts of the opening of the insulating layer, and is formed to leave exposed a second sidewall part opposite to the first sidewall part.

8. The package of claim 1, wherein the connecting bump further comprises a metal pillar and a solder adhesive layer formed on an upper surface of the metal pillar.

9. The package of claim 1, further comprising a non-conductive adhesive layer configured to be adhered to the substrate,
wherein the connecting bump passes through the non-conductive adhesive layer using the slope of the sloped surface.

10. A package of an electronic device, comprising:
a substrate configured to allow first and second connecting contact parts respectively to be exposed to upper and lower surfaces thereof;
first and second step difference layers configured to respectively cover the upper and lower surfaces of the substrate so that the first and second connecting contact parts are exposed to the upper and lower surfaces of the substrate; and
first and second connecting bumps configured to be respectively connected to the first and second connecting contact parts so that one end part of the first and second connecting bumps are extended on the first and second step difference layers, and respectively have first and second sloped surfaces inclined at different angles from each other on upper surfaces of the first and second connecting bumps where the first and second sloped surfaces are formed by step differences formed by the first and second step difference layers.

11. The package of claim 10, wherein the first and second step difference layers have different thicknesses from each other so that the first and second sloped surfaces of the first and second connecting bumps are formed to have different slopes from each other.

12. The package of claim 10, further comprising through electrodes configured to respectively have the first and second connecting contact parts as exposed surfaces where the through electrodes pass through the substrate.

13. A package of an electronic device, comprising:
a first substrate configured to allow a first connecting contact part to be exposed on a surface thereof;
a first step difference layer configured to cover the first substrate so as to leave the first connecting contact part exposed;
a first connecting bump configured to be connected to the first connecting contact part so that one end part of the first connecting bump is extended on the first step difference layer, and has a first sloped surface formed on an upper surface of the first connecting bump where the first sloped surface is formed by a step difference formed by the first step difference layer;
a second substrate configured to allow a second contact part to be exposed on a surface thereof so as to be opposite to the first connecting contact part;
a second step difference layer configured to cover the second substrate so as to leave the second connecting contact layer exposed;
a second connecting bump configured to be connected to the second connecting contact part so that one end part of the second connecting bump is extended on the second step difference layer, and has a second sloped surface formed on an upper surface of the second connecting bump where the second sloped surface is formed by a step difference formed by the second step difference layer;
a conductive adhesive layer configured to come in contact with the first and second sloped surfaces so as to adhere the first and second connecting bumps to each other; and
a non-conductive adhesive layer configured to surround the first and second connecting bumps and the conductive adhesive layers so as to adhere the first and second step difference layers to each other.

14. The package of claim 13, wherein the first and second substrates are semiconductor substrates of semiconductor chips on which integrated circuits are integrated, or the first substrate is a package substrate including a PCB or interposer and the second substrate is a semiconductor substrate of a semiconductor chip on which an integrated circuit is integrated.

15. The package of claim 13, wherein the first and second step difference layers have different thicknesses so that the first and second sloped surfaces of the first and second connecting bumps have different slopes.

16. The package of claim 13, wherein the first and second sloped surfaces of the first and second connecting bumps are inclined opposite to each other, and the conductive adhesive layer is a layer extended and inclined to the first and second substrates.

17. The package of claim 13, wherein the first and second sloped surfaces of the first and second connecting bumps are inclined opposite to each other so as to have different slopes from each other, and the conductive adhesive layer is a layer extended and inclined to the first and second substrates so that a thickness of the layer is increased along the first and second sloped surfaces.

18. The package of claim 13, wherein the non-conductive adhesive layer is a non-conductive paste (NCP) layer or non-conductive film (NCF) layer.

19. A package of an electronic device, comprising:
a first substrate configured to allow a first connecting contact part to be exposed on a surface thereof;
a first connecting bump configured to be connected to the first connecting contact part;
a second substrate configured to allow a second connecting contact part to be exposed to a surface thereof so as to be opposite to the first connecting contact part;
a step difference layer configured to cover the second substrate so as to leave the second connecting contact part exposed;
a second connecting bump configured to be connected to the second connecting contact part so that one end part of the second connecting bump is extended on the step difference layer, and have a sloped surface formed on an upper surface of the second connecting bump where the sloped surface is formed by a step difference formed by the step difference layer;
a conductive adhesive layer configured to come in contact with an upper surface of the first connecting bump and the sloped surface of the second connecting bump so as to adhere the first and second connecting bumps to each other; and
non-conductive adhesive layers configured to surround the first and second connecting bumps and the conductive adhesive layer so as to adhere the first and second substrates to each other.

20. The package of claim 19, wherein the first connecting bump has a flat upper surface or an inclined upper surface having a slope different from the sloped surface of the second connecting bump.

21. A package of an electronic device, comprising:
a first semiconductor substrate configured to allow first and second connecting contact parts to be respectively exposed on upper and lower surfaces thereof;
first and second step difference layers configured to respectively cover the upper and lower surfaces of the first semiconductor substrate so as to leave the first and second connecting contact layers exposed;
first and second connecting bumps configured to be respectively connected to the first and second connecting contact parts so that one end part of each of the first and second connecting bumps are extended on the first and second step difference layers, and respectively have first and second sloped surfaces inclined different from each other on upper surfaces of the first and second connecting bumps where the sloped surfaces are formed by step differences formed by the first and second step difference layers;
a second semiconductor substrate configured to allow a third connecting contact part to be exposed to a surface thereof so as to be opposite to the first connecting contact part;
a third step difference layer configured to cover the second substrate so as to leave the third connecting contact part exposed;
a third connecting bump configured to be connected to the third connecting contact part so that one end part of the third connecting bump is extended on the third step difference layer, and have a third sloped surface formed on an upper surface of the third connecting bump where the third sloped surface is formed by a step difference formed by the third step difference layer;
first conductive adhesive layers configured to come in contact with the first to third sloped surfaces so as to adhere the first to third connecting bumps to each other;
a first non-conductive adhesive layer configured to surround the first to third connecting bumps and the first conductive adhesive layers so as to adhere the first to third step difference layers to each other;

a package substrate configured to allow a fourth connecting contact part to be exposed on a surface thereof so as to be opposite to the second connecting contact part;

a second conductive adhesive layer configured to come in contact with the fourth connecting contact part and the second sloped surface so as to adhere the second connecting bump and the fourth connecting contact part to each other; and a second non-conductive adhesive layer configured to surround the second connecting bump, the fourth connecting contact part and the second conductive adhesive layer so as to adhere the package substrate and the second step difference layer to each other.

22. The package of claim 21, further comprising:

a fourth step difference layer configured to cover a surface of the package substrate so as to leave the fourth connecting contact part exposed; and a fourth connecting bump configured to be connected to the fourth connecting contact part so that one end part of the fourth connecting bump is extended on the fourth step difference layer, and having a fourth sloped surface formed on an upper surface of the fourth connecting bump where the fourth sloped surface is formed by a step difference formed by the fourth step difference layer.

23. A package of an electronic device, comprising:

semiconductor substrates configured to be stacked so that each of the semiconductor substrates has first and second connecting bumps having first and second sloped surfaces as upper surfaces thereof, which are formed on upper and lower surfaces thereof, respectively, and the first sloped surfaces of the first connecting bumps are aligned opposite to the second sloped surfaces of the second connecting bumps;

conductive adhesive layers configured to each come in contact with the first and second sloped surfaces so as to adhere the first and second connecting bumps of the two stacked semiconductor substrates to each other;

non-conductive adhesive layers configured to surround the first and second connecting bumps and connecting parts of the conductive adhesive layers so as to adhere the semiconductor substrates to one another; and a package substrate configured to allow the stacked semiconductor substrates mounted thereon.

24. The package of claim 23, further comprising step difference layers configured to respectively have one end part extended to surfaces of the semiconductor substrates and interfaces of the first and second connecting bumps so as to provide step differences forming the first and second sloped surfaces to the first and second connecting bumps.

25. A system comprising:

a main board; and a package of an electronic device to be mounted on the main board, wherein the package of the electronic device comprises:

a first substrate configured to allow a first connecting contact part to be exposed on a surface thereof;

a first step difference layer configured to cover the first substrate so as to leave exposed the first connecting contact part;

a first connecting bump configured to be connected to the first connecting contact part so that one end part of the first connecting bump is extended on the first step difference layer, and has a first sloped surface formed on an upper surface of the first connecting bump where the first sloped surface is formed by a step difference formed by the first step difference layer;

a second substrate configured to allow a second contact part to be left exposed on a surface thereof so as to be opposite to the first connecting contact part;

a second step difference layer configured to cover the second substrate so as to leave the second connecting contact layer exposed;

a second connecting bump configured to be connected to the second connecting contact part so that one end part of the second connecting bump is extended on the second step difference layer, and has a second sloped surface formed on an upper surface of the second connecting bump where the second sloped surface is formed by a step difference formed by the second step difference layer;

a conductive adhesive layer configured to come in contact with the first and second sloped surfaces so as to adhere the first and second connecting bumps to each other; and a non-conductive adhesive layer configured to surround the first and second connecting bumps and the conductive adhesive layers so as to adhere the first and second step difference layers to each other.

26. A package of an electronic device, comprising:

a first package substrate configured to allow a first connecting contact part to be exposed on a surface thereof;

a first step difference layer configured to cover the first package substrate so as to leave the first connecting contact part exposed;

a first connecting bump configured to be connected to the first connecting contact part so that one end part of the first connecting bump is extended on the first step difference layer, and have a first sloped surface formed on an upper surface of the first connecting bump where the first sloped surface is formed by a step difference formed by the first step difference layer;

a semiconductor substrate configured to allow a second connecting contact part opposite to the first connecting contact part to be left exposed on one surface thereof, and allow a second package substrate to be attached to a surface opposite to the one surface thereof;

a second step difference layer configured to cover the semiconductor substrate so as to leave the second connecting contact part exposed;

a second connecting bump configured to be connected to the second connecting contact part so that one end part of the second connecting bump is extended on the second step difference layer, and have a second sloped surface formed on an upper surface of the second connecting bump by a step difference formed by the second step difference layer;

a conductive adhesive layer configured to come in contact with the first and second sloped surfaces so as to adhere the first and second connecting bumps to each other; and a non-conductive adhesive layer configured to surround the first and second connecting bumps and the conductive adhesive layer and be extended to cover a side of a semiconductor chip and the second package substrate so that the semiconductor chip is embedded between the first and second package substrates.

* * * * *